(12) United States Patent
Menard et al.

(10) Patent No.: US 10,656,189 B2
(45) Date of Patent: May 19, 2020

(54) MICROCONTROLLER INCLUDING POWER SUPPLY MONITORING

(71) Applicant: Atmel Corporation, San Jose, CA (US)

(72) Inventors: Patrice Menard, Saint-Mars-du-Desert (FR); Thierry Gourbilleau, Le Loroux-Bottereau (FR); Thibault Kervaon, Nantes (FR); Régis Vix, Sainte Luce sur Loire (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 16/161,861

(22) Filed: Oct. 16, 2018

(65) Prior Publication Data

US 2019/0049494 A1    Feb. 14, 2019

Related U.S. Application Data

(62) Division of application No. 14/982,427, filed on Dec. 29, 2015, now Pat. No. 10,126,337.

(51) Int. Cl.

| G01R 21/133 | (2006.01) |
|---|---|
| G01R 19/165 | (2006.01) |
| G05B 15/02 | (2006.01) |
| G05B 19/042 | (2006.01) |
| G06F 1/28 | (2006.01) |

(52) U.S. Cl.
CPC ..... *G01R 21/133* (2013.01); *G01R 19/16528* (2013.01); *G05B 15/02* (2013.01); *G05B 19/0428* (2013.01); *G06F 1/28* (2013.01); *G05B 2219/25289* (2013.01)

(58) Field of Classification Search
CPC .............................. G01R 21/133; G05B 15/02
USPC ............................................... 307/66; 702/60
See application file for complete search history.

(56) References Cited

U.S. PATENT DOCUMENTS

| 6,084,382 A * | 7/2000 | Hite ........................... H02J 7/36 320/116 |
|---|---|---|
| 7,991,588 B1 * | 8/2011 | Krieger ..................... G06F 1/26 702/186 |
| 2014/0001861 A1 * | 1/2014 | Mann ........................ G06F 1/30 307/66 |

OTHER PUBLICATIONS

Atmel 42385G-SAM L21 Datasheet Complete, Nov. 20, 2015, 1228 pages.
Atmel 42402B-SAM L22 Datasheet Preliminary, Nov. 2015, 1210 pages.

\* cited by examiner

*Primary Examiner* — Anthan Tran
(74) *Attorney, Agent, or Firm* — Fish & Richardson P.C.

(57) ABSTRACT

A microcontroller is operable to monitor power supply levels corresponding, respectively, to a first power supply (e.g., a main power supply) and a second power supply (e.g., a battery backup power supply). In one or more modes of operation, the same brownout detector in the microcontroller alternately monitors signals corresponding, respectively, to the first and second power supply levels.

9 Claims, 5 Drawing Sheets

MICROCONTROLLER INCLUDING POWER SUPPLY MONITORING

CLAIM OF PRIORITY

This application is a divisional of and claims priority to U.S. patent application Ser. No. 14/982,427, filed on Dec. 29, 2015, the entire contents of which are hereby incorporated by reference.

TECHNICAL FIELD

The present disclosure relates to microcontrollers including power supply monitoring.

BACKGROUND

Some microcontrollers and other devices are operable to receive power from any one of multiple power supplies. For example, in some cases, a microcontroller is operable to be powered from either a main power supply or a battery backup power supply. The microcontroller can be switched between a first VDD supply pin to receive power from the main power supply and a second VBAT supply pin to receive power from the battery backup supply. The back-up battery power supply can be used, for example, if the microcontroller detects that the voltage for the main power supply falls below a threshold level, such as during a loss of main power. In such situations, it is desirable to monitor the main power supply to determine when main power is restored, or when main power supply is above the threshold level, so that the microcontroller can exit the battery backup mode.

SUMMARY

The present disclosure describes microcontrollers that are operable to monitor power supply levels corresponding, respectively, to a first power supply (e.g., a main power supply) and a second power supply (e.g., a battery backup power supply). In one or more modes of operation, the same brownout detector in the microcontroller alternately monitors signals corresponding, respectively, to the first and second power supply levels.

For example, according to one aspect, a method of monitoring power for a microcontroller includes alternately monitoring a first power supply level and a second power supply level. The first power supply level corresponds to a first power supply and the second power supply level corresponds to a second power supply. Monitoring of both the first and second power supply levels is performed by the same brownout detector.

Some implementations include one or more of the following features. For example, alternately monitoring the first and second power supplies can include causing the brownout detector to monitor the first and second power supply levels alternately in a sampled fashion. In some cases, the second power supply level is monitored for a greater percentage of time than the first power supply level. In some implementations, the brownout detector compares a voltage for the first power supply level to a first threshold value, and compares a voltage for the second power supply level to a second threshold value. In some instances, alternately monitoring the first and second power supplies can be performed while the microcontroller is in a battery-powered backup mode. The method further can include exiting the battery-powered backup mode if the voltage for the first power supply level exceeds the first threshold level.

In accordance with another aspect, the present disclosure describes a microcontroller that includes a first terminal for electrical connection to a first power supply, and a second terminal for electrical connection to a battery backup power supply. The microcontroller also includes a first switch operable for electrical connection to either the first terminal or the second terminal, and a brownout detector including a second switch operable for electrical connection either to an output of the first switch output or to the first terminal. A digital processor is operable to control respective positions of the first and second switches. When the first switch is electrically connected to the second terminal, the second switch alternately is connected electrically to the output of the first switch and to the first terminal.

In yet a further aspect, an apparatus includes a first power supply, a second power supply, and a microcontroller. The microcontroller includes a first terminal electrically connected to the first power supply, and a second terminal electrically connected to the second power supply. A first switch is operable for electrical connection to either the first terminal or the second terminal. A brownout detector includes a second switch operable for electrical connection either to the first switch output or the first terminal. A digital processor is operable to control respective positions of the first and second switches. The microcontroller is operable in a first mode in which the first switch is electrically connected to the first power supply and the second switch in the brownout detector is electrically connected to the first switch output. The microcontroller also is operable is a second mode in which the first switch is electrically connected to the second power supply, and the second switch alternately is connected electrically to the first switch output and to the first terminal.

Various implementations include one or more advantages. For example, in some cases, the techniques described here can provide significant savings, both in terms of power consumption as well as chip area.

Other aspects, features and advantages will be readily apparent from the following detailed description, the accompanying drawings and the claims.

DETAILED DESCRIPTION

The present disclosure describes microcontrollers that are operable, for example, in a battery-powered backup mode. When operating in the battery-powered backup mode, the microcontroller monitors first and second power supply levels corresponding, respectively, to a first power supply (e.g., a main power supply) and a battery backup power supply. Monitoring of both the first and second power supply levels in the battery-powered backup mode is performed by the same brownout detector in the microcontroller.

Figure 1:
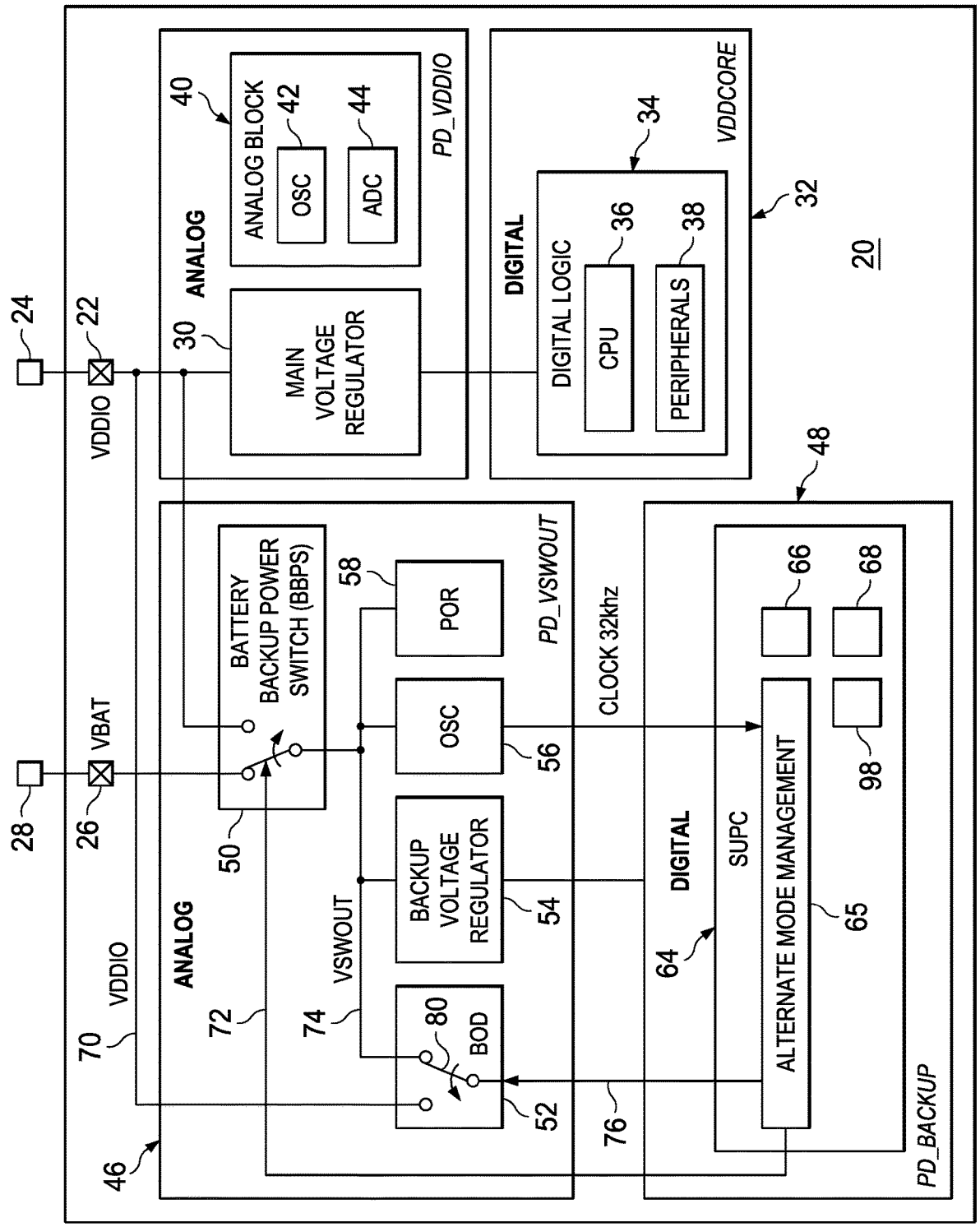
FIG. 1 illustrates components of a power domain for an example microcontroller.

FIG. 1 illustrates an overview of the power system 20 for an example microcontroller. The microcontroller is operable for connection, through a first power supply pin (VDDIO) or other terminal 22, to a first main power supply (e.g., main battery or other power supply) 24 that nominally provides voltage in the range 1.62-3.63 volts (V). The microcontroller also is operable for connection, through a second power supply pin (VBAT) or other terminal 26, to a battery backup power supply 28 that nominally provides voltage in the range 1.62-3.63 V.

The power system 20 includes both analog and digital domain circuitry. As shown in the example of FIG. 1, the analog domain circuitry includes a main voltage regulator 30 such as a low dropout (LDO) regulator and/or a buck converter powered through the VDDIO pin 22. The main voltage regulator 30 supplies voltage to VDDCORE digital circuitry 32, including digital logic 34 such as a central processing unit (CPU) 36 and peripherals 38. The VDDIO pin 22 also supplies power to an analog block 40 that can include, for example, oscillators (OSC) 42 and analog-to-digital converters (ADC) 44, as well as other circuitry.

The power system 20 also includes backup analog domain circuitry 46 and backup domain digital circuitry 48. The analog domain circuitry 46 includes a battery backup power switch (BBPS) 50. The selection of the battery backup power switch 50 is set to VDDIO at power-up, and power to the battery backup power switch 50 is supplied by the backup voltage regulator 54, which is supplied by the main power source 24 through the VDDIO pin 22. Power supply to the backup domain is switched automatically to the battery backup power supply 28 through the VBAT pin 26 when a brownout detector (BOD) 52 detects that the main power supply 24 is below a previously set first threshold level. Power supply to the backup domain is switched back to the main power supply 24 through the supply pin 22 when the brownout detector 52 detects that the main power supply 24 is above the first threshold value. Further details of the brownout detector 52 are described below.

As shown in the example of FIG. 1, the backup domain analog circuitry 46 also includes a backup voltage regulator 54, an internal oscillator (OSC) 56 operating, for example, at 32.768 kHz, and power-on-reset (POR) circuit 58. The power-on-reset circuit 58 monitors the voltage VSWOUT at the output of the battery backup power switch 50. Monitoring by the power-on-reset circuit 58 can be activated continuously, including at startup and during sleep modes. If VSWOUT goes below the threshold voltage, the power-on-reset circuit 58 resets the entire chip. The voltage VSWOUT is provided to the brownout detector 52, the backup voltage regulator 54, the oscillator 56 and the power-on-reset circuit 58.

The backup domain digital circuitry 48 includes a supply controller (SUPC) 64 that manages the voltage reference, power supply and supply monitoring of the device. The supply controller 64 controls the voltage regulators 30, 54 for the core and backup domains. The supply controller 64 also supports connection of battery backup circuitry 46, 48 to the VBAT power pin 26 and includes functionality to enable automatic power switching between the main power supply 24 and the battery backup power supply 28. This functionality can help ensure power to the backup domain 46, 48 when the main battery or power source 24 is unavailable. The supply controller 64 also includes an alternate mode management module 65 coupled to the brownout detector 52, which, as mentioned above, is operable to monitor the voltage levels (e.g., VDDIO or VBAT) applied to the microcontroller.

When the brownout detector 52 detects that the main power supply 24 is below the first threshold level, the device switches to the battery backup mode in which the core analog circuitry 30, 40 and core digital circuitry 32 are powered off. In the battery backup mode, the backup domain circuitry 46 is powered by the battery backup power supply 28. The digital backup domain 48 is powered by the backup voltage regulator (54) which is powered by 28 through VSWOUT. In battery backup mode, analog power domain 46 is supplied by VSWOUT (which is connected to VBAT), and digital domain 48 is supplied by the backup voltage regulator 54 powered by VSWOUT.

In general, when the microcontroller is not in the battery backup mode, the brownout detector 52 monitors the voltage level of the main power supply 24 (e.g., by monitoring the internal voltage VSWOUT). On the other hand, when the microcontroller is in the battery backup mode, the brownout detector 52 monitors both the voltage level of the main power source 24 (e.g., by monitoring the voltage on connection 70 to the VDDIO pin 22) and also the voltage level of the battery backup power source 28 (e.g., by monitoring the internal voltage level VSWOUT). In the battery backup mode, a switch 80 in the brownout detector 52 is operable to switch back and forth between the line 74 (i.e., to monitor the voltage on VBAT pin 26) and the line 70 (i.e., to monitor the voltage on VDDIO pin 22). The position of the switch 80 can be controlled by a signal (VDD_SEL) from the module 65 in the digital backup domain. The VSS_SEL control signal is provided to the brownout detector 52 on line 76.

Figure 2:
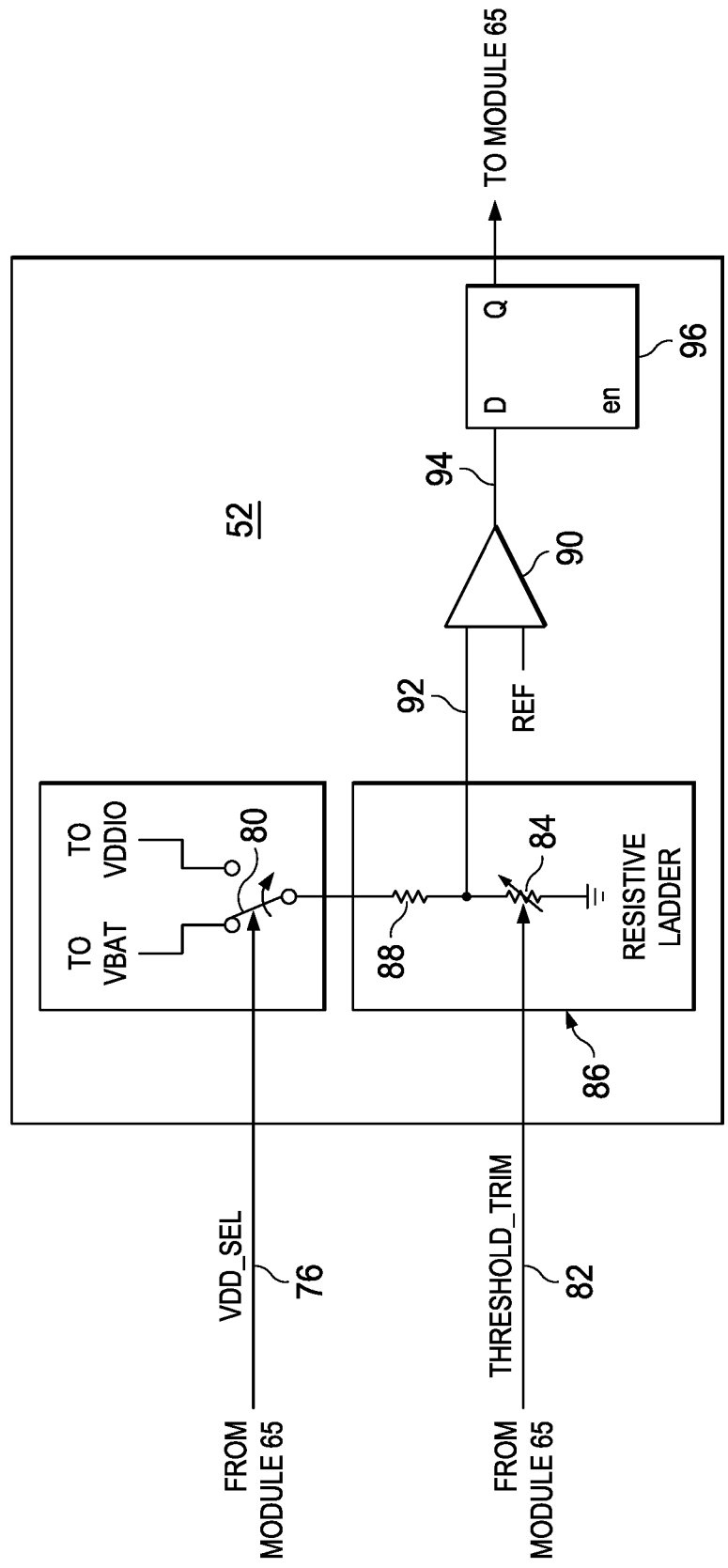
FIG. 2 illustrates an example of a brownout detector circuit.

FIG. 2 illustrates further details of a particular implementation of the brown out detector circuit 52. In addition to the VDD_SEL control signal received on line 76 to control the position of the switch 80, the illustrated brownout detector 52 is operable to receive another signal (THRESHOLD_TRIM) on line 82. The THRESHOLD_TRIM signal is generated based on a previously-stored user-selected value and is used by the brownout detector 52 to control the value of an adjustable resistor 84 that forms part of a resistive ladder 86 to which the power supply pin (VBAT or VDDIO) is coupled. The resistive ladder 86 can include one or more resistive elements (e.g. resistors) 88 connected in series with the adjustable resistor 84. An output of the resistive ladder 86 is provided over line 92 to a comparator 90, which receives a reference voltage (REF) as an input to a second input terminal. In the illustrated example, the reference voltage (REF) has a value of 1.1 volts. This value may differ in other implementations.

The comparator 90 compares the voltage on line 92 to the reference voltage (REF) and generates an output indicative of the whether the voltage on line 92, which is proportional to the voltage at the power supply pin (VBAT or VDDIO), is greater or less than the reference voltage (REF). For example, in some implementations, if the voltage on line 92 (which is proportional to the voltage on the selected power supply pin, VBAT or VDDIO) is greater than the reference voltage (REF), the comparator 90 generates a high output. On the other hand, if the voltage on line 92 is equal to or less than the reference voltage (REF), the comparator 90 generates a low output. Thus, the reference voltage (REF) serves as a threshold value, with respect to which a voltage corresponding to the voltage on the selected power supply pin VBAT or VDDIO is compared. The output of the comparator 90 on line 94 is latched by a flip-flop 96, which provides the latched value to the module 65 in the backup digital domain. The module 65 then can use the received signal to determine the appropriate position of the switch 80 in the brownout detector 52 and/or the position of the battery backup power switch 50.

Figure 3:
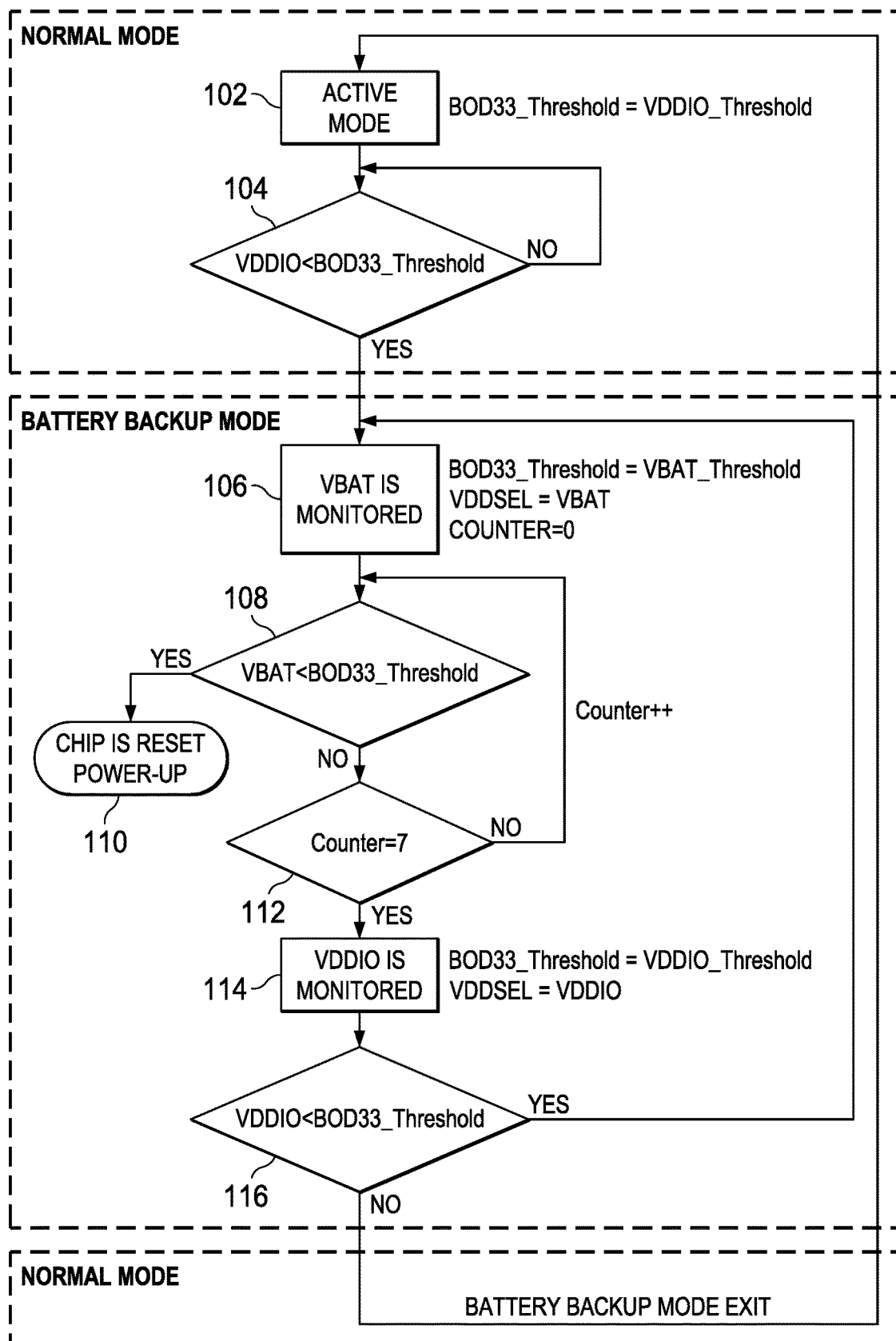
FIG. 3 is a flow chart of a method of monitoring power supply voltages.

FIG. 3 illustrates details of an example of monitoring the supply voltages implemented by the supply controller 64 and brownout detector 52. As indicated by 102, operation is in an active mode in which a brownout detector register 68 is set to a first threshold level ("VDDIO Threshold"), which corresponds, for example, to a minimum permissible level for the main power supply 24. As indicated by 104, the brownout detector 52 determines whether the voltage level of the main power supply 24 is lower than the first threshold level. The brownout detector 52 can do this by monitoring the voltage level of the internal voltage VSWOUT. So long as the voltage level of the main power supply 24 is not determined to be lower than the first threshold level, the brownout detector 52 continues to monitor the voltage level of the main power supply 24.

If the process of FIG. 3 determines that the voltage level of the main power supply 24 is lower than the first threshold level, operation of the microcontroller is changed to the battery backup mode, and the alternate mode management module 65 causes the battery backup power switch 50 to be connected electrically to the VBAT pin 26. The module 65 accomplishes this by providing a switch control signal on line 72, which is coupled to the switch 50 (FIG. 1).

When the microcontroller is in the battery backup mode, the brownout detector 52 alternately monitors the voltage of the battery backup source 28 and the voltage of the main power source 24. As indicated by 106 (FIG. 3), initially the voltage (VBAT) of the battery backup source 28 is monitored. The value of the brownout detector register 68 is set to a second threshold level ("VBAT_Threshold"), which corresponds, for example, to a minimum permissible value of the battery backup source 28. Also, a counter 66 (FIG. 1) is reset to zero. The counter 66 is used, as will become apparent below, to indicate the number of consecutive times the brownout detector 52 has checked the value of the battery backup supply 28. As indicated by 108 (FIG. 3), the brownout detector 52 determines whether the voltage level of the battery backup supply 28 is lower than the second threshold level. The brownout detector 52 can do this by monitoring the voltage level of the internal voltage VSWOUT. In some cases, the first and second threshold levels are the same.

In the event the process of FIG. 3 determines that the voltage level of the battery backup supply 28 is lower than the second threshold level, the supply controller 64 resets the microcontroller chip, as indicated by 110. On the other hand, if the process of FIG. 3 determines that the voltage level of the battery backup supply 28 is not lower than the second threshold level, it determines whether the value stored by the counter 66 is equal to a predetermined positive integer (e.g., 7).

If, at 112, the value stored by the counter 66 is equal to the predetermined number (e.g., 7), the process switches, at 114, to monitor the voltage level of the main power supply 24 rather than the voltage level of the battery backup power supply 28. The value stored by the register 68 is again set to the first threshold value. At 116, the brownout detector 52 determines whether the voltage level of the main power supply 24 is lower than the first threshold level. In this case, the brownout detector 52 does this by monitoring the voltage level at the VDDIO pin 22. If the process determines that the voltage level of the main power supply 24 is still lower than the first threshold level, the process returns to 106 so as to monitor the voltage level of the battery backup supply source 28. On the other hand, if (at 116) the process determines that the voltage level of the main power supply 24 is no longer lower than the first threshold level, the determination serves as an indication that the proper voltage level is available from the main power supply 24. Thus, the process exits the battery backup mode and continues the process at 102 (i.e., operation in the active mode in which the brownout detector 52 monitors the voltage level of the main power supply 24 by monitoring the voltage level of the internal voltage VSWOUT).

It is apparent from the process of FIG. 3 that when the microcontroller is operating in the battery-powered backup mode, the brownout detector 52 alternately monitors power supply levels corresponding, respectively, to the battery backup power supply 28 and the main power supply 24. Monitoring of both the first and second power supply levels is performed by the same brownout detector 52.

The following table summarizes the states of the switches 50 and 80 based on the mode of operation.

|  | Battery backup power switch 50 | Brownout detector switch 80 |
| --- | --- | --- |
| Normal mode (main power supply) | Connects line 74 to VDDIO pin 22 | Connects brownout detector 52 to line 74 |
| Battery-powered backup mode | Connects line 74 to VBAT pin 26 | Alternately connects brownout detector 52 between line 74 and line 70 |

Depending on the implementation, alternate monitoring of the two voltage levels (VBAT and VDDIO) when the microcontroller is operating in the battery backup mode can be performed either in a first manner, in which the two voltage levels are monitored continuously in an alternating fashion, or in a second manner, in which the two voltage levels are sampled periodically in an alternating fashion. These modes or operation are described in greater detail below in connection with FIGS. 4 and 5.

Figure 4:
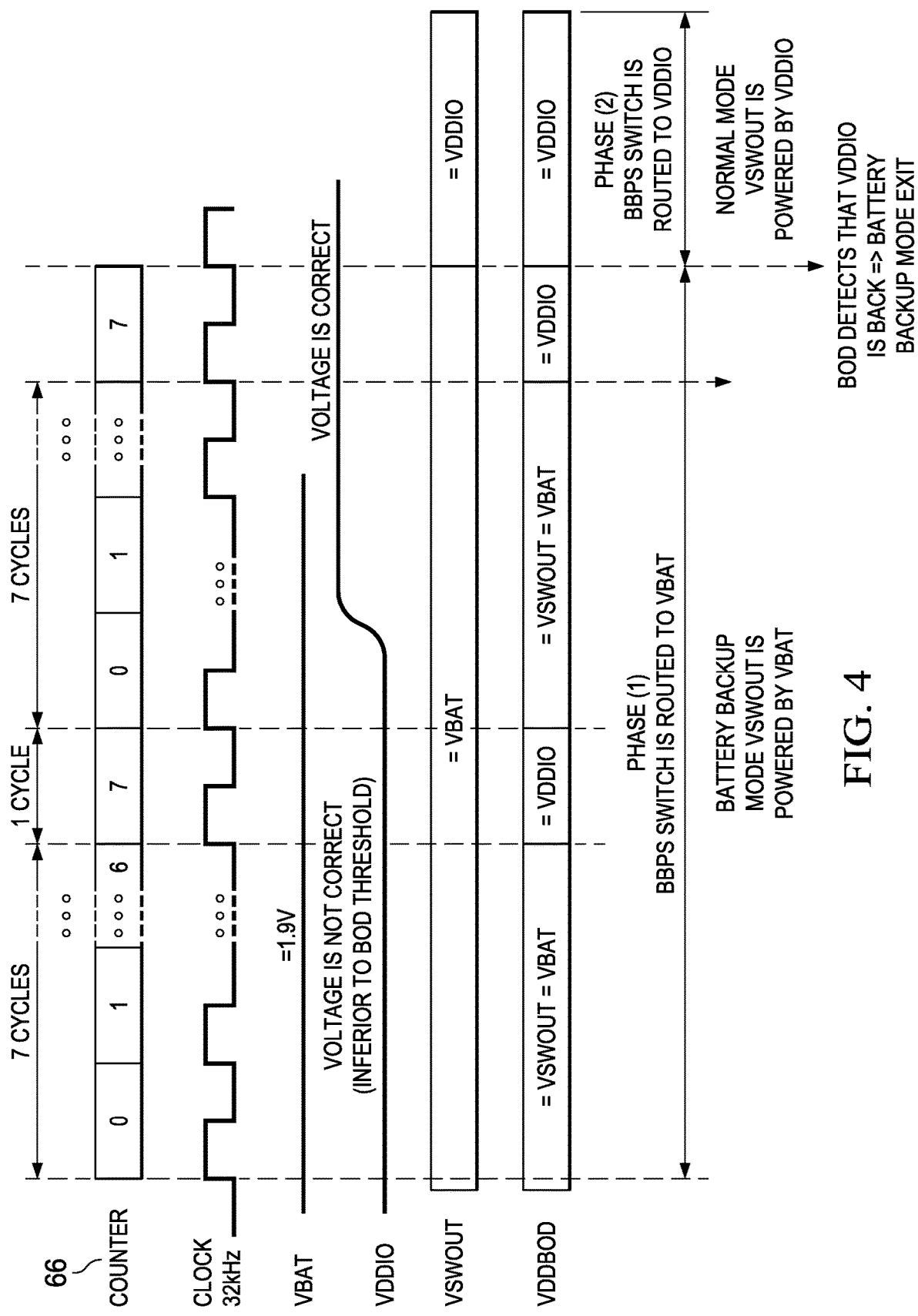
FIG. 4 is a timing diagram showing an example of monitoring in an alternating continuous mode.

FIG. 4 is a timing diagram illustrating an example of monitoring by the brownout detector in which the two voltage levels (VBAT and VDDIO) are monitored continuously in an alternating fashion. The voltage VDDBOD indicates the voltage being monitored by the brownout detector 52 during each count of the counter 66. It is assumed that during operation in the battery-powered backup mode (indicated as Phase 1 in FIG. 4), the brownout detector 52 monitors the battery backup power supply 28 for seven cycles before monitoring the main power supply 124 in a single cycle. Such a ratio (7:1) is reasonable for applications in which monitoring the voltage VDDIO at pin 22 is less critical than monitoring the internal voltage VSWOUT. However, by changing the value of the maximum positive integer stored by the counter 66, the ratio can be changed. For example, if the maximum number stored by the counter 66 is one ('1'), the brownout detector 52 would alternate back and forth between monitoring the battery backup power supply 28 and the main power supply 24 each counter cycle so long as the process determines that the voltage corresponding to the main power supply 24 remains below the first threshold value. Other values for the maximum number stored by the counter 66 can be used as well. In any event, the sequence can be managed by the alternate mode management module 65 in the supply controller 64, which is clocked with the 32 kHz clock 56 available in the battery backup mode.

As indicated by the right-hand side of FIG. 4, when the brownout detector 52 detects that the main power supply 24 is available again (i.e., the voltage corresponding to the main power supply 28 is greater than the first threshold value), the microcontroller exits the battery backup mode. In particular, the module 65 triggers the battery backup power switch 50 to change its position so as to route the line 74 for the VSWOUT voltage to the VDDIO pin 22 so that the brownout detector 52 can monitor the voltage for the main battery supply 28. This is indicated in FIGS. 3 and 4 as Phase 2 or normal mode, in which voltage VSWOUT on line 74 is powered by VDDIO.

Figure 5:
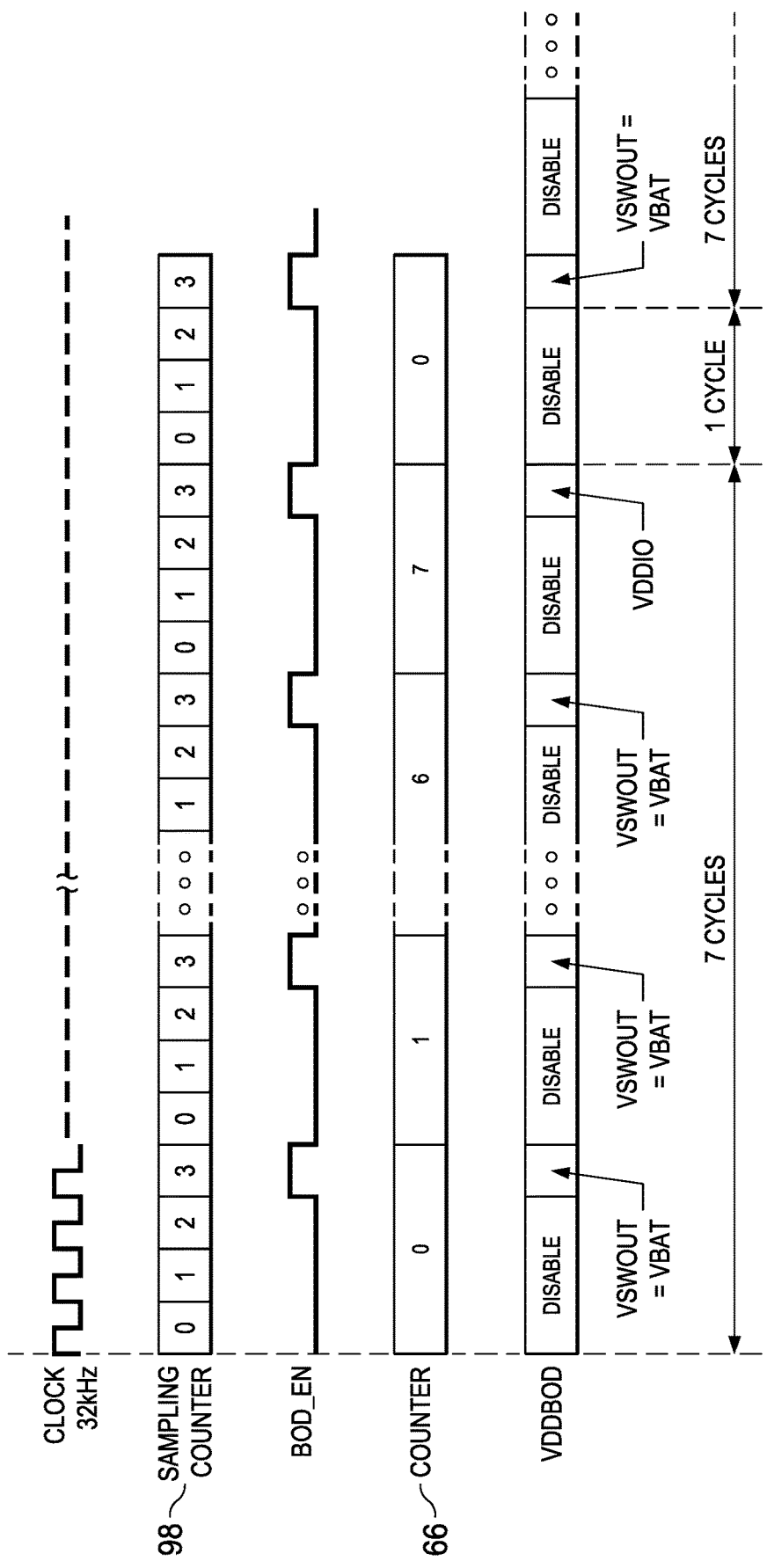
FIG. 5 is a timing diagram showing an example of monitoring in an alternating sampled mode.

Power consumption by the brownout detector 52 tends to be relatively high in some implementations. To reduce consumption, the brownout detector 52 can be operated in a sampling mode in which it is enabled/disabled in a periodic fashion. FIG. 5 illustrates an example of such a sampling mode of operation. In this case, the brownout detector 52 monitors the selected supply voltage level for a short period of time and then returns to an idle mode. A sampling mode counter 98 in the digital backup domain 48 (FIG. 1) can be used to trigger a signal (BOD EN) that enables the brownout detector 52 periodically. In some instances, the frequency of the sampling mode counter 98 is adjustable by a user. Here too, when the microcontroller is operating in the battery back-up mode, the brownout detector 52 alternates between detecting the voltage corresponding to the VBAT pin 26 and the voltage corresponding to the VDDIO pin 22.

Although the foregoing examples are described in the context of the second power supply being a battery-powered backup supply, in other implementations the second power supply need not be a battery power supply and/or need not be a backup power supply. Thus, the second power supply can be implemented as other types of power supplies.

In some cases, the power domains described above can provide significant savings, both in terms of power consumption as well as chip area, for microcontrollers that incorporate the foregoing techniques.

Various aspects of the subject matter and the functional operations described in this disclosure (e.g., the supply controller 64 and the alternate mode management module 65) can be implemented in digital electronic circuitry, or in computer software, firmware, or hardware, including the structures disclosed in this specification and their structural equivalents, or in combinations of one or more of them.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Computer readable media suitable for storing computer program instructions and data include all forms of non-volatile memory, media and memory devices, including by way of example semiconductor memory devices, e.g., EPROM, EEPROM, and flash memory device. The processor and the memory can be supplemented by, or incorporated in, special purpose logic circuitry.

Various modifications within the spirit of the present disclosure can be made. Accordingly, other implementations are within the scope of the claims.

What is claimed is:

1. A method of monitoring power for a microcontroller, the method comprising:
    alternately monitoring a first power supply level and a second power supply level, wherein the first power supply level corresponds to a first power supply and the second power supply level corresponds to a second power supply, wherein monitoring of both the first and second power supply levels is performed by a same brownout detector, and wherein the method includes monitoring the second power supply level for a greater percentage of time than the first power supply level.

2. The method of claim 1 wherein alternately monitoring the first and second power supplies is performed while the microcontroller is in a battery-powered backup mode.

3. The method of claim 1 wherein alternately monitoring the first and second power supplies includes causing the brownout detector to monitor the first and second power supply levels alternately in a sampled fashion.

4. The method of claim 1 including:
    comparing, by the brownout detector, a voltage for the first power supply level to a first threshold value; and
    comparing, by the brownout detector, a voltage for the second power supply level to a second threshold value.

5. The method of claim 4 wherein alternately monitoring the first and second power supplies is performed while the microcontroller is in a battery-powered backup mode, the method including exiting the battery-powered backup mode when the voltage for the first power supply level exceeds the first threshold level.

6. The method of claim 2 including switching a position of a switch in the brownout detector back and forth between first and second positions while the microcontroller is in the battery-powered backup mode.

7. The method of claim 6 including providing a signal from a module in a digital backup domain to control the position of the switch in the brownout detector.

8. The method of claim 1 wherein the first and second power supply levels are monitored continuously by the brownout detector in an alternating fashion.

9. The method of claim 1 wherein the first and second power supply levels are sampled periodically by the brownout detector in an alternating fashion.

* * * * *